United States Patent [19]

Yamashita et al.

[11] 3,753,055

[45] Aug. 14, 1973

[54] FIELD EFFECT SEMICONDUCTOR DEVICE

[75] Inventors: Akio Yamashita, Ikeda-shi; Takashi Fujita, Toyonaka-shi, both of Japan

[73] Assignee: Matsushita Electric Industrial Co., Ltd., Kadoma-shi, Osaka, Japan

[22] Filed: Dec. 28, 1971

[21] Appl. No.: 213,128

[30] Foreign Application Priority Data

Dec. 28, 1970 Japan .............................. 45/124925

[52] U.S. Cl.317/235 R, 317/235 AB, 317/235 AA, 317/235 B

[51] Int. Cl. ............................................ H01l 11/10

[58] Field of Search .................. 317/235 B, 235 AB, 317/235 G, 235 AA

[56] References Cited

UNITED STATES PATENTS

| | | | |
|---|---|---|---|
| 3,437,891 | 4/1969 | Yamashita | 317/235 |
| 3,090,873 | 5/1963 | Macintosh | 307/88.5 |
| 3,243,669 | 3/1966 | Sah | 317/234 |
| 3,391,287 | 7/1968 | Kao et al. | 307/302 |

*Primary Examiner*—Martin H. Edlow

*Attorney*—Richard K. Stevens, Robert J. Frank et al.

[57] ABSTRACT

A field effect semiconductor switching device of high breakdown voltage and large current capacity having negative resistance characteristics which are controllable by an electric field.

2 Claims, 9 Drawing Figures

FIELD EFFECT SEMICONDUCTOR DEVICE

This invention relates to an improvement in a field effect semiconductor device and more particularly to a field effect semiconductor device adapted to serve as a solid state switch of large current capacity, high breakdown voltage and stable operation, the negative resistance characteristics of which can be controlled through an electric field.

Conventionally, field effect thyristors have been proposed as semiconductor devices having an electric resistance which can be controlled through an electric field. The conventional thyristors, however, have the disadvantage that they cannot simultaneously have a large current density and a high breakdown voltage.

An object of this invention is to provide a field effect semiconductor device having negative resistance characteristics controllable by an electric field, a large current capacity and a high breakdown voltage and which is stable in operation.

According to the present invention there is provided a field effect semiconductor device comprising: a semiconductor body of one conductivity type having two principal surfaces; a first and a second regions of the other conductivity type formed in one surface of the body; a third region of the other conductivity type formed in the other surface opposite to said one surface; a fourth region of said one conductivity type formed in said second region; an insulating layer formed on said one surface at least between said first and second regions; and electrodes formed on said first, third and fourth regions and on said insulating layer between said first and second regions.

Hereinbelow, description will be made in connection with the accompanying drawings, in which:

FIGS. 1 and 2 are schematic cross sections of conventional field effect semiconductor devices;

FIG. 3 in a schematic cross section of an embodiment of a field effect semiconductor device according to the invention;

Figure 1:
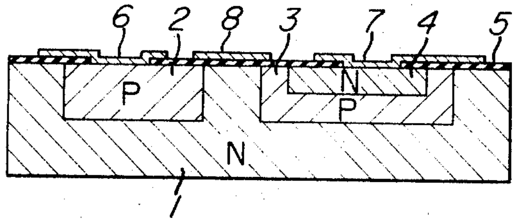
FIG. 1 PRIOR ART
Figure 2:
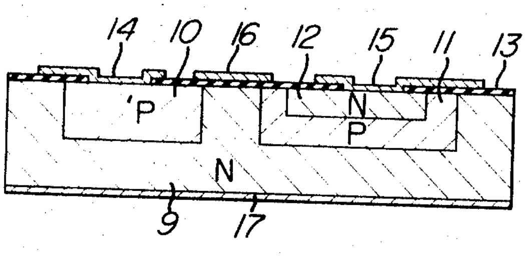
FIG. 2 PRIOR ART

First, conventional thyristors are shown in FIGS. 1 and 2. In FIG. 1, a three-terminal field effect thyristor comprises an *n* type semiconductor body 1, *p* type regions 2 and 3 mutually separated and formed in the *n* type semiconductor body 1, an *n* type region 4 formed in the *p* type region 3, an insulating layer 5, and electrodes 6, 7 and 8 respectively formed on the *p* type region 2, the *n* type region 4 and the insulating layer 5 between the regions 2 and 3. These electrodes 6, 7 and 8 serve as an anode, a cathode and a gate, respectively.

In FIG. 2, a four-terminal field effect thyristor comprises an n type semiconductor body 9, p type regions 10 and 11, an *n* type region 12, an insulating layer 13, and electrodes 14, 15 and 16, similar to that of FIG. 1. The thyristor of FIG. 2 further comprises another electrode 17 formed on the other surface of the semiconductor body. Said electrodes 14, 15, 16 and 17 serve as an anode, a cathode, a first gate, and a second gate, respectively.

The thyristor of FIG. 2 can have a much larger current capacity than that of the thyristor of FIG. 1, but cannot have a very high reverse breakdown voltage.

Figure 3:
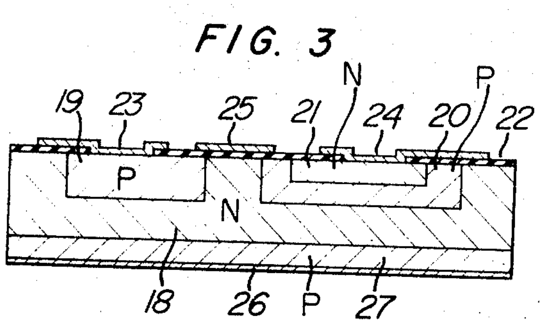

This invention solves this drawback and an embodiment thereof is shown in FIG. 3. A field effect semiconductor device according to the invention comprises, as shown in the figure, an n type semiconductor body 18, *p* type regions 19 and 20, another *n* type region 21, an insulating layer 22, electrodes 23, 24, 25 and 26 and another *p* type region 27 intervening between the body 18 and the electrode 26, the feature of this embodiment lying in the existence of the *p* type region 27 compared with the conventional device of FIG. 2.

Figure 4:
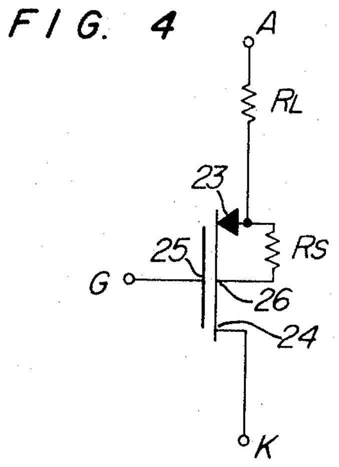
FIG. 4 is an equivalent circuit diagram of the device shown in FIG. 3.
Figure 5:
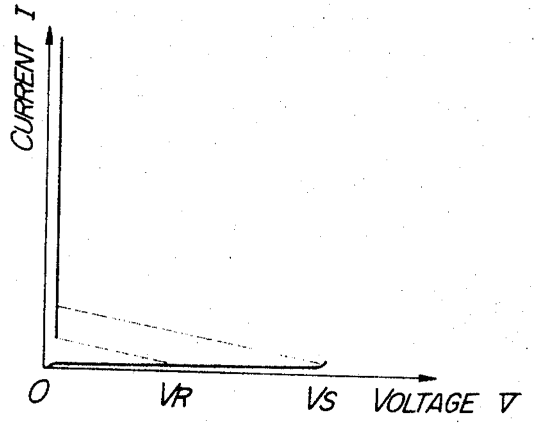
FIG. 5 is the voltage — current characteristic curves of the device of FIG. 3.
Figure 6:
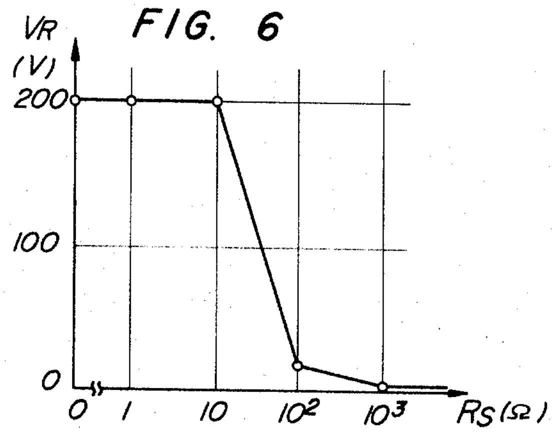
FIG. 6 is a voltage $V_R$ — resistance $R_S$ characteristic curve of the device of FIG. 3.

Next, the characteristics and principles of the semiconductor device according to the invention will be described in connection with the circuit example as shown in FIG. 4. Numerals and symbols in FIG. 4 corresponds to those of FIG. 3. Terminals A, K and G denote anode, cathode, and gate terminals respectively. A load resistance $R_L$ is connected between the electrode 23 and the anode terminal A, and a resistance $R_S$ between the electrodes 23 and 26. The current-voltage characteristics between the electrodes 23 and 24 are as shown in FIG. 5. Initially ($V=0$), the circuitry is in the "OFF" state. As the voltage V is raised, it turns to an "ON" state at a voltage $V_S$. As the voltage V is lowered, it changes from the "ON" state to the "OFF" state, returning to a voltage $V_R$. The value of $V_R$ changes depending on the value of $R_S$. When $R_S$ becomes small as in FIG. 6, the values of $V_S$ and $V_R$ approach each other. Namely, when $R_S$ becomes small, $V_R$ increases.

Figure 7:
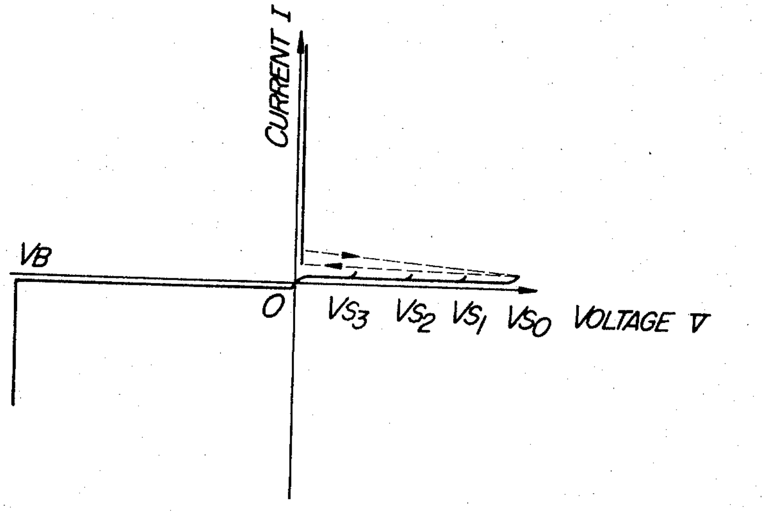
FIG. 7 is voltage-current characteristic curves of the device of FIG. 3 at a resistance $R_S = 0$.
Figure 8:
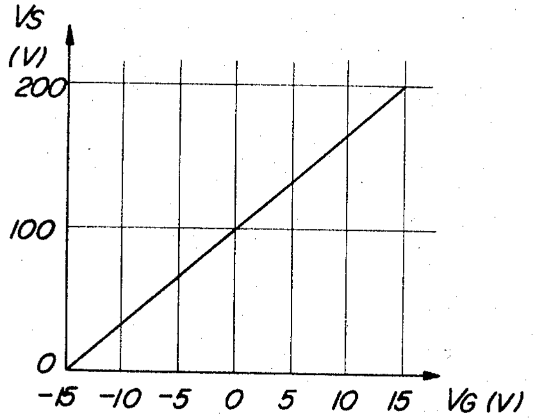
FIG. 8 is a voltage $V_G$ — voltage $V_S$ characteristic curve of the device of FIG. 3.

The current-voltage characteristics between electrodes 23 and 24 in the state of $R_S = 0$, i.e. when the electrodes 23 and 26 are short-circuited, is shown in FIG. 7. In the case of FIG. 3, a negative resistance characteristic can be obtained when the electrode 23 becomes positive. In FIG. 7, $V_{SO}$ represents the switching voltage in the absence of a gate voltage. As a negative voltage is applied to the gate, the switching voltage decreases as $V_{S1}$, $V_{S2}$, $V_{S3}$ as shown in the figure. The switching voltage increases, of course, when a positive voltage is applied to the gate. The manner of this change is shown in FIG. 8 as the relation between the switching voltage $V_S$ and the gating voltage $V_G$. Further, in FIG. 7, $V_B$ represents the reverse breakdown voltage, a feature of this invention lying in the possibility of high $V_B$. In the conventional devices as shown in FIG. 2, $V_B$ was at most 100 V, whereas in the inventive structure $V_B$ can be raised nearly up to 1000 V. This is caused by the fact that the reverse breakdown voltage is supported by the two pn junctions, e.g. in FIG. 3 junctions between the n and p regions 18 and 27 and between the n and p regions 21 and 20. Although conductivity types are indicated in the above description to help in understanding it, it would be obvious that no change occurs by interchanging the conductivity types. Further, the basis for providing a negative resistance characteristics is formed by the thyristor function of the conventional four-layered pnpn structure.

Figure 9:
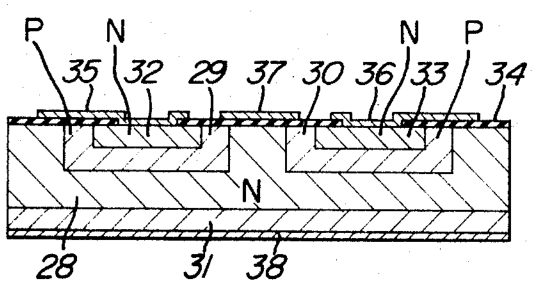
FIG. 9 is a cross section of another embodiment of a field effect semiconductor device according to the invention.

It is also possible to provide an npnpn or pnpnp structure as shown in FIG. 9 according to the invention, in which case the device works as a bidirectional switching element. The semiconductor device shown in FIG. 9 comprises an n type semiconductor body 28, p type regions 29, 30 and 31 separately formed in the body 28 as shown in the figure, *n* type regions 32 and 33 formed in the *p* type regions 29 and 30, an insulating layer 34 formed on one surface, and electrodes 35, 36, 37 and 38 formed on the regions 32 and 33, the insulating layer 34, and the region 31. The electrodes 37 and 38 work as first and second gates. Here, the semiconductor matrix is formed of known Ge, Si, GaAs, SiC, GaP, InAs, etc.

Now, another and more concrete embodiment of the invention will be described. First, an element as shown in FIG. 3 was formed by the known impurity diffusion technique, using *n* type Si. In this case, a $SiO_2$ film was used as the insulating layer 22. A circuit as shown in FIG. 4 was formed with this element. Setting $R_S = 0$ in the circuit, the current-voltage characteristics were measured and then negative resistance characteristics as shown in FIG. 7 were obtained. In this case, since $R_S = 0$, the values of $V_S$ and $V_R$ were identical. The value of $V_S$ changed according to the distance between the p type regions 19 and 20 and the specific resistivity of the n type semiconductor body 18, and extended from about 20 to 800 V. Reverse breakdown voltages up to 1000 V were obtained, a considerable improvement compared with the conventional devices. Further, the controllable current extended from several tens of milliamperes to several tens of amperes, the magnitude of which also forms another feature of this invention.

As has been clearly described hereinabove, according to the field effect semiconductor device of the invention, currents extending from several tens of milliamperes to several tens of amps can be on-off controlled only by the gate voltage and further a reverse breakdown voltage up to 1000 V is possible. Therefore, this invention has great industrial utilities as a power switching element.

What we claim is:

1. A field effect semiconductor device comprising, in combination, a semiconductor substrate of one conductivity type having two principal surfaces, first and second regions formed in one surface of said semiconductor substrate and having a conductivity type opposite to that of said semiconductor substrate, a third region of said opposite conductivity type formed in the other surface opposite to said one surface of said semiconductor substrate, a single fourth region of said one conductivity type formed in said second region, an insulating layer formed on said one surface at least between said first and second regions, first and second electrodes connected to said first and fourth regions respectively, a first gate electrode on said insulating layer, a second gate electrode connected on said third region, and means for shorting said first electrode and said second gate electrode, the current flowing between said first and second electrodes being on-off controlled by the bias voltage applied to the first gate electrode by shorting of the first electrode and the second gate electrode, the reverse breakdown voltage being supported by the two pn junctions between the semiconductor substrate and the third region and between the fourth and the second region.

2. A field effect semiconductor device comprising, in combination, a semiconductor substrate of one conductivity type having two principal surfaces, first and second regions formed in one surface of said semiconductor substrate and having a conductivity type opposite to that of said semiconductor substrate, a third region of said opposite conductivity type formed in the other surface opposite to said one surface of said semiconductor substrate, a single fourth region of said one conductivity type formed in said second region, a single fifth region of said one conductivity type formed in said first region, an insulating layer formed on said one surface at least between said first and second regions, first and second electrodes connected to said fifth and fourth regions respectively, a first gate electrode on said insulating layer, a second gate electrode connected on said third region, and means for shorting said first electrode and said second gate electrode, the current flowing between said first and second electrodes being on-off controlled by the bias voltage applied to the first gate electrode by shorting of the first electrode and the second gate electrode.

* * * * *